United States Patent [19]

Gehrmann

[11] Patent Number: 4,547,711
[45] Date of Patent: Oct. 15, 1985

[54] METHOD AND APPARATUS FOR PRODUCING SAWTOOTH WAVE DEFLECTION CURRENT FOR TELEVISION APPARATUS

[75] Inventor: Rainer Gehrmann, Alsbach-Hähnlein, Fed. Rep. of Germany

[73] Assignee: Robert Bosch GmbH, Stuttgart, Fed. Rep. of Germany

[21] Appl. No.: 609,735

[22] Filed: May 14, 1984

[30] Foreign Application Priority Data

May 13, 1983 [DE] Fed. Rep. of Germany ....... 3317465

[51] Int. Cl.⁴ .................. H01J 29/70; H01J 29/76
[52] U.S. Cl. .................... 315/408; 315/403; 315/389
[58] Field of Search ............... 315/408, 387, 388, 389, 315/403

[56] References Cited

U.S. PATENT DOCUMENTS

| | | | |
|---|---|---|---|
| 3,796,827 | 3/1974 | Riechmann | 315/408 |
| 4,200,824 | 4/1980 | Farinia et al. | 315/408 |
| 4,381,477 | 4/1983 | Bergmans | 315/408 |
| 4,477,749 | 10/1984 | Schmale | 315/388 |

*Primary Examiner*—Theodore M. Blum
*Attorney, Agent, or Firm*—Frishauf, Holtz, Goodman & Woodward

[57] ABSTRACT

A first regulating amplifier (7) provides a linearly increasing current to the horizontal deflection coil during the forward trace sweep and the amplifier is disconnected from the deflection coil and its parallel capacitor (2) during the retrace period to provide flyback by free reaction of the oscillating circuit. In order to shorten the retrace period an auxiliary coil (17) is energized with a regulated current during the forward trace sweep with the help of a second regulating amplifier (8) gated on during a preliminary portion of the line interval and a controllable voltage source (14) set thereby. During a first portion of the retrace interval currents flowing respectively in the auxiliary coil and in the horizontal deflection coil are stored in the capacitor (2), which discharges during the remainder of the retrace period only through the deflection coil.

5 Claims, 7 Drawing Figures

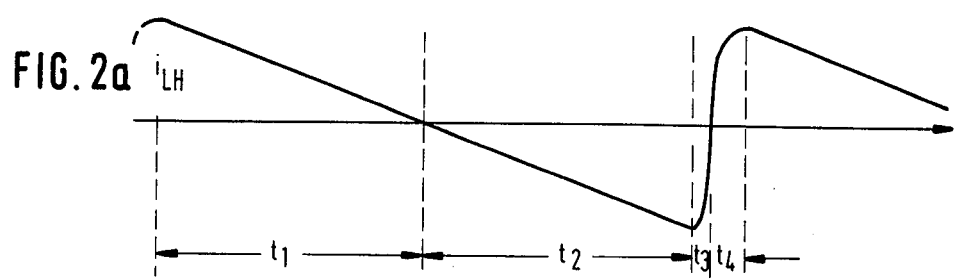
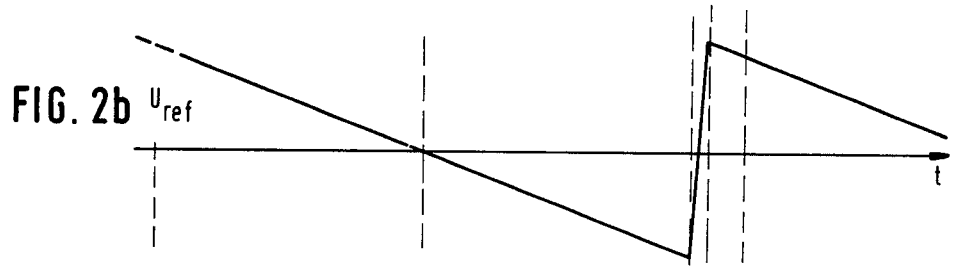
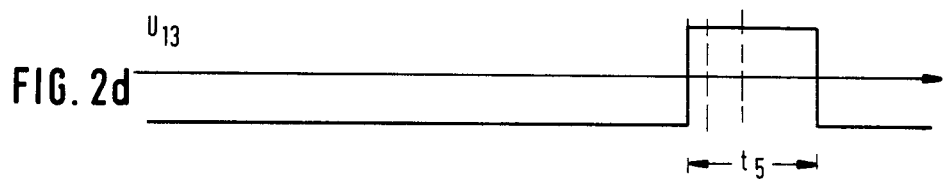
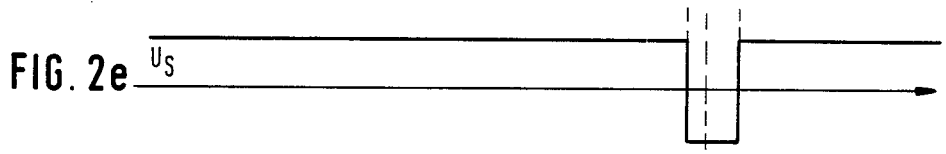

METHOD AND APPARATUS FOR PRODUCING SAWTOOTH WAVE DEFLECTION CURRENT FOR TELEVISION APPARATUS

This invention concerns generation of sawtooth waves for scanning line deflection in television cameras, monitors and receivers and particularly, waves of high linearity produced in apparatus having current regulation for linearizing the deflection current during the forward trace sweep while the circuit allows a free flyback relaxation oscillation for the retrace.

The problem in such cases is to provide for starting the new forward sweep trace with suitable initial conditions. One method of so doing is described in German published patent application DE-OS No. 31 07 735, where during the retrace interval, a supplementary auxiliary voltage is applied to the deflection coil in order to reach the desired initial value of the deflection current for the forward trace sweep. In this case a supplementary auxiliary voltage source must be provided and its voltage, moreover, must be substantially higher than the operating voltage serving to generate the deflection current.

SUMMARY OF THE INVENTION

It is an object of the present invention to provide a method and circuit improving those described above in such a way as to provide especially rapid flyback, thus shortening the retrace time, while maintaining a high degree of linearity for the forward trace sweep.

Briefly, energy is stored in an auxiliary coil by a putting a regulated current therethrough during the forward trace sweep and then during a first part of the retrace interval, both the current flowing in the auxiliary coil and the current flowing in the deflection coil transfer their energy into a common store, typically a capacitor, and during the remainder of the retrace period, that energy is discharged through the deflection coil. The regulated current for storing energy in the auxiliary coil is advantageously measured out by comparing the current in the deflection coil during an initial portion of the line scan interval with a reference current value. This comparison is preferably done in a separate comparison amplifier, while another comparison amplifier performs a well-known function of linearizing the current during forward trace sweep.

It is advantageous in this method and circuit for the current put through the auxiliary coil to be provided by a controllable voltage source, the output voltage of which is set by the comparison amplifier, which is gated by a synchronizing pulse for the television line sweep. Finally, it is also advantageous to provide synchronized switches for interruption during the retrace period in response to horizontal synchronizing pulses, both for the supply of current to the auxiliary coil and for the supply of current to the deflection coil, in order to allow the flyback operation to proceed as a relaxation oscillation. The capacitor above-mentioned, like capacitors heretofore used in different circuits to form a resonant circuit with the deflection coil, should be of such a size that it can function effectively in step with the rhythm of the sawtooth waves of the line-scanning frequency.

BRIEF DESCRIPTION OF THE DRAWINGS

The invention is further described by way of illustrative example with reference to the annexed drawings, in which:

FIGS. 2a, 2b, 2c, 2d, 2e and 2f are graphs drawn to the same time scale respectively representing current or voltage waves at various points in the circuit of FIG. 1.

DESCRIPTION OF THE ILLUSTRATED EMBODIMENTS

Figure 1:
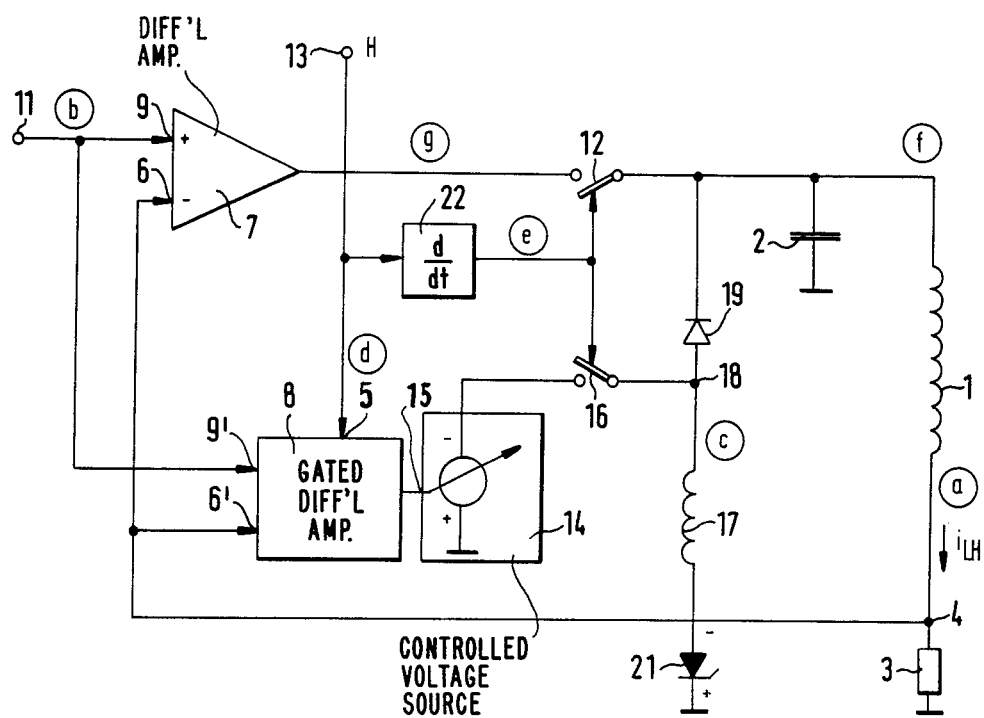
FIG. 1 is a circuit block diagram of apparatus for carrying out the method of the invention.

FIG. 1 shows a deflection circuit for generating a sawtooth current wave in the horizontal (line) deflection coil of a television camera pick-up tube. The deflection coil 1 may actually comprise two coils symmetrically located about the tube, but it is operated as a single coil and referred to herein simply as a coil.

A capacitor 2, having one terminal grounded to "apparatus ground" is connected effectively in parallel with the deflection coil 1, thus producing a resonant circuit. A currentmeasuring resistor 3 is connected in series with the deflection coil 1, between the coil and ground. The connection point 4 connecting the deflection coil 1 and the resistor 3 is connected with the respective measured value inputs 6 and 6' of the regulating amplifiers 7 and 8 which are constituted as comparison result amplifiers respectively having reference value inputs 9 and 9' to which a reference sawtooth wave signal is applied from a reference signal source represented by the terminal 11.

The output of the amplifier 7 is connected over a first synchronized interruptor switch 12 (which may be referred to as a gate switch) to the resonant circuit composed of the deflection coil and the capacitor 2, particularly at the junction of those two elements as shown in FIG. 1. The regulating amplifier 8 is gated by synchronizing pulses of horizontal line-scanning frequency by applying these pulses in a suitable way to one of its control terminals. The gate control connection or terminal of the amplifier 8 is designated 5 in FIG. 1. The terminal 13 represents the source of horizontal synchronizing pulses in the television camera connected to that terminal.

The output of the amplifier 8 is connected to the control input 15 of a controllable voltage source 14, the output of which is connected through a second synchronized interruptor switch 16 to an auxiliary coil 17. The connection point 18 of the switch 16 to the auxiliary coil 17 is also connected through a diode 19 with the resonant circuit 1,2 of the deflection circuit, again at the junction of the deflection coil 1 and the capacitor 2. The other end of the coil 17 is connected through a Zener diode 21 over to ground. The two synchronized interruptor switches 12 and 16 are controlled through a differentiating circuit 22 by horizontal sychronizing pulses applied to the terminal 13.

The function of the illustrated deflection circuit can best be explained with reference to the curves shown in FIGS. 2a-2f. During the forward trace sweep which takes place during the combined intervals $t_1$ and $t_2$ the switches 12 and 16 are closed and regulation of the deflection current $i_{LH}$ that flows in the coil 1 is produced by the amplifier 7. The coil current $i_{LH}$ has the magnitude shown in FIG. 2a. The deflection coil current is measured by the measuring resistor 3 and a signal representing its actual value is supplied to the input of the amplifier 7. This actual value signal is compared with the reference value signal $U_{ref}$ illustrated in FIG. 2b which is applied to the input 9 of the amplifier 7 so that as a result of the comparison provided in the amplifier 7 a regulated current for the horizontal deflection coil 1 is made available at the output of the amplifier 7. As shown in FIG. 2a, a positive current flows in the deflection coil 1 during the time interval $t_1$ and a negative current (i.e. current in the opposite direction) flows therein during the time interval $t_2$.

At the same time the voltage source 14 controlled by the regulation amplifier 8 produces, through the switch 16 a current in the auxiliary coil 17, of the form shown in FIG. 2c. By appropriate poling of the diode 19 interposed between the circuit point 18 and the deflection oscillation circuit, the auxiliary coil 17 is uncoupled during this period from the oscillation circuit so that the current resulting from the application of the output voltage of the source 14 can flow only between the source 14 and the coil 17. The regulating amplifier 8 is keyed (gated) on only during the interval $t_5$, as shown in FIG. 2d, by the horizontal synchronizing pulses provided at the terminal 13, which are supplied to the control electrode of the amplifier 8, so that only during this interval is a comparison carried out between the actual value and reference value signals respectively applied to the inputs 9' and 6'. But as shown in FIG. 2c, the control voltage source 14 continues to supply current to the coil 17 during the remainder of the forward trace sweep.

At the beginning of the retrace the switches 12 and 16 are opened by the leading edge of the horizontal synchronizing pulse differentiated by the circuit 22, so that both coils 1 and 17 are thereby separated from their respective voltage sources. In that way it is possible, at the beginning of the interval $t_3$ (identified in FIG. 2a) for both the deflection current $i_{LH}$ (FIG. 2a) which has just reached its maximum negative value, and the auxiliary coil current $i_{LB}$ (FIG. 2c) which has likewise just reached its negative maximum value, to flow into the capacitor 2. While the retrace deflection voltage at the capacitor 2, shown in FIG. 2f, reaches its maximum in about the middle of the retrace interval, both the current $i_{LH}$ flowing in the deflection coil 1 and the current $i_{LB}$ flowing in the auxiliary coil 7 become zero. At the beginning of the second part $t_4$ of the retrace period the capacitor 2 can give back the energy stored which came from the two coils 1 and 17 and, on account of the polarity of the diode 19, it can furnish that energy only to the deflection coil 1.

At the end of the second part $t_4$ of the retrace period the deflection current $i_{LH}$ reaches its positive maximum value. At this moment that will be equal to the reference signal value $U_{ref}$ shown in FIG. 2b if the current $i_{LB}$ had the correct value at the end of the previous forward trace sweep as set by the operation of the regulating amplifier 8. This value tends to correct itself with successive operation in successive time intervals $t_5$ of the amplifier 8.

The proper value for the capacitor 2 for the desired resonance is when the line-scanning frequency is 15625 Hz and the inflection coil inductance is 0.8 mH is, for example, In such case, the inductance of the auxiliary coil 17 is, for example, 0.8 mH.

Although the invention has been described with reference to particular illustrative examples, it will be understood that modifications and variations are possible within the inventive concept.

I claim:
1. Method of generating a sawtooth current wave in the horizontal deflection coil of a television apparatus equipped with current regulation for linearizing the current during the forward trace sweep and with a deflection circuit configuration providing for free flyback during the retrace, comprising the steps of:
   dynamically storing energy in an auxiliary coil (17) by putting a regulated current therethrough during the entire duration of the forward trace sweep;
   during substantially the first part ($t_3$) of the retrace interval, leading both the current flowing in said auxiliary coil and the current flowing in said deflection coil into electrostatic energy storage means (2), and
   during the remainder of the retrace period, discharging through said deflection coil the energy collected in said electrostatic energy storage means.

2. Method according to claim 1 in which said regulated current put through said auxiliary coil during the forward trace sweep is regulated by comparison, during an initial
   portion of the line scan interval of the current in said deflection coil with a reference current value, the results of said comparison continuing to affect the magnitude of said current during the remainder of the forward sweep until the next retrace interval.

3. Electric circuit apparatus for generating a sawtooth linear sweep wave for the horizontal deflection coil of a television apparatus comprising, in addition to said deflection coil:
   a measuring resistance grounded at one end and connected at its other end to a first terminal of said deflection coil;
   a capacitor (2) connected to a second terminal of said deflection coil and to ground, of a capacitance such as to provide a resonant circuit together with said deflection coil at a resonance frequency suitable for resonant charging and discharging thereof in a horizontal television scanning circuit;
   an auxiliary coil (17), connected at one end to the ungrounded terminal of said capacitor through a diode, the other end of said auxiliary coil being connected to a fixed potential;
   first and second comparison result amplifiers (7,8) each having a first input (9,9') connected to a source (11) of reference sawtooth waves and a second input (6,6') connected to the connection of said measuring resistance to said deflection coil, the output of said first comparison result amplifier being connected through a first synchronized gate switch (12) to said resonant circuit (1,2), said second comparison result amplifier (8) being constituted to provide, during the forward trace period of said linear sweep wave, an output of a magnitude controlled by the result of comparison of its inputs during an interval comprising a line retrace interval of said linear sweep wave and a beginning portion of said forward trace period and having an input connection (5) for application of a signal source (13) of synchronizing pulses of the horizontal scanning frequency of said television apparatus for determining said interval, and
   a source of controllable voltage (14) having a voltage control input (15) connected to the output of said second comparison result amplifier (8) and a controlled-voltage output connected through a second synchronized gate switch (16) to the end of said auxiliary coil (17) which is connected to said diode (19), said first and second synchronized gate switches being connected for control thereof to a source of pulses of the horizontal scanning frequency of said television apparatus for application of said pulses simultaneously and in the same sense to both said gate switches.

4. Apparatus according to claim 3 in which signal differentiating means (22) are connected to the source of synchronizing pulses (13) to which is connected said gate control terminal (5) of said second comparison result amplifier, and in which said synchronized gate switches are connected for control purposes to the output of said signal differentiating means.

5. Apparatus according to claim 3 in which the end of said auxiliary coil (17) connected to a fixed potential is connected to a Zener diode (21) interposed between said coil and ground potential.

* * * * *